United States Patent [19]

Kondner, Jr.

[11] Patent Number: 5,047,708
[45] Date of Patent: Sep. 10, 1991

[54] APPARATUS FOR TESTING CIRCUIT BOARDS

[76] Inventor: Robert L. Kondner, Jr., 409A E. Preston St., Baltimore, Md. 21202

[21] Appl. No.: 290,268

[22] Filed: Dec. 23, 1988

[51] Int. Cl.⁵ ............................................ G01R 31/00
[52] U.S. Cl. ............................. 324/73.1; 324/158 R; 371/16.2; 371/22.1
[58] Field of Search ............ 324/73 R, 73 PC, 158 F, 324/73.1, 158 R; 364/579; 371/16.2, 22.1, 15.1

[56] References Cited

U.S. PATENT DOCUMENTS

| | | | |
|---|---|---|---|
| 3,676,777 | 7/1972 | Charters | 324/73 R |
| 3,832,535 | 8/1974 | De Vito | 324/73 AT |
| 3,904,861 | 9/1975 | McNamara | 324/158 F |
| 3,922,537 | 11/1975 | Jackson | 324/73 R |
| 3,924,109 | 12/1975 | Jhu et al. | 371/25.1 |
| 4,012,625 | 3/1977 | Bowen et al. | 324/73 R |
| 4,125,763 | 11/1978 | Drabing et al. | 324/73 R |
| 4,152,644 | 5/1979 | Lockhart, Jr. | 324/73 R |
| 4,168,527 | 9/1979 | Winkler | 324/73 R |
| 4,230,986 | 10/1980 | Deaver et al. | 324/73 PC |
| 4,371,923 | 2/1983 | Hyatt | 364/200 |
| 4,412,327 | 10/1983 | Fox et al. | 324/73 R |
| 4,504,783 | 3/1985 | Zasio et al. | 324/158 F |
| 4,637,020 | 1/1987 | Schinabeck | 324/73 R |
| 4,713,758 | 12/1987 | De Kelaita et al. | 371/15.1 |
| 4,714,875 | 12/1987 | Bailey et al. | 324/73 PC |
| 4,829,520 | 5/1989 | Toth | 371/22.1 |
| 4,831,560 | 5/1989 | Zaleski | 364/424.03 |
| 4,862,458 | 8/1989 | Baginski | 371/15.1 |

OTHER PUBLICATIONS

"Dedicated Logic Analyzer Minimizes Setup Problems", by Spector, Electronics, 9/28/78, pp. 136-139.

Primary Examiner—Kenneth A. Wieder
Assistant Examiner—William J. Burns

[57] ABSTRACT

The testing of printed circuit boards is facilitated by a device which comprises a plurality of switches for electrically connecting or disconnecting the circuit board from electronic equipment which uses it, such as a small computer. The apparatus connects between the bus terminals on the computer and those on the printed circuit board and provides a plurality of switches controlling the connection of address, data, control and power signals. The switches are controlled in a predetermined sequence such that the electronic equipment need not be shut down to permit removal and replacement of the circuit board.

20 Claims, 2 Drawing Sheets

FIG. I

APPARATUS FOR TESTING CIRCUIT BOARDS

TECHNICAL FIELD

This invention relates to the art of testing printed circuit boards used with electronic equipment. In particular, the invention relates to a device for testing printed circuit boards for use in a small computer.

BACKGROUND ART

In the manufacture of printed circuit boards for use with small computers or other electronic equipment, it is common to test the circuit board prior to shipment. A common technique for testing a printed circuit board is to install it in a target piece of equipment, such as a small computer, and to run a diagnostic program in that computer.

This technique is time consuming because the equipment must be turned off during installation or removal of the printed circuit board. The requirement for turning off the circuit board arises from the necessity for maintaining the integrity of the circuit board by providing the various bus signals in the proper sequence. For example, it is generally desired to provide power to the circuit board prior to connecting data or control circuits. Similarly, the data and control circuits should be opened prior to turning off the power.

Devices for use in testing circuits are known in the patent literature. For example, U.S. Pat. Nos. 3,904,861 (McNamara) and 4,230,986 (Deaver) show extension boards for use in testing a printed circuit. The extension boards plug into a computer, and the circuit board being tested is attached to the extension board. Other testing devices are shown in U.S. Pat. Nos. 3,676,777 (Charters); 4,152,644 (Lockhart, Jr.); and 4,504,783 (Zasio).

SUMMARY OF THE INVENTION

In accordance with the invention, a printed circuit board may be tested by inserting an apparatus comprising a plurality of switches and a timing circuit for controlling the operation of the switches into a target piece of equipment. A "target" piece of equipment is of the type in which the circuit board is intended to be used and may include a small computer with a bus for receiving the circuit board. The inventive apparatus includes a terminal for removably receiving the printed circuit board to be tested such that the circuit board may be easily attached for testing, removed after testing, and a subsequent circuit board may be attached and tested. The switches are arranged to connect the bus of the computer to the bus of the circuit board such that the power, data, control, and address signals are connected and disconnected in a predetermined sequence.

In one embodiment, the switches are field-effect transistor (FET) switches, but other types of switches may be employed, including logic elements. The timing circuit of this embodiment uses RC combinations to provide voltages to the field-effect transistors, the time constants being designed to effect the desired sequence of switching.

In a second embodiment, the timing circuit is a microprocessor programmed to receive signals from the bus and to control the transistor switches in the desired sequence.

An object of this invention is to provide a method for testing a circuit for use in a small computer or other electronic equipment whereby the equipment remains activated during the testing of several printed circuit boards.

A further object of this invention is to provide an apparatus for attachment to a small computer, the apparatus being adapted to receive a circuit board under test and comprising a plurality of switches for connecting and disconnecting the bus of the small computer to the bus of the circuit board.

DETAILED DESCRIPTION OF THE DRAWINGS

Figure 1:
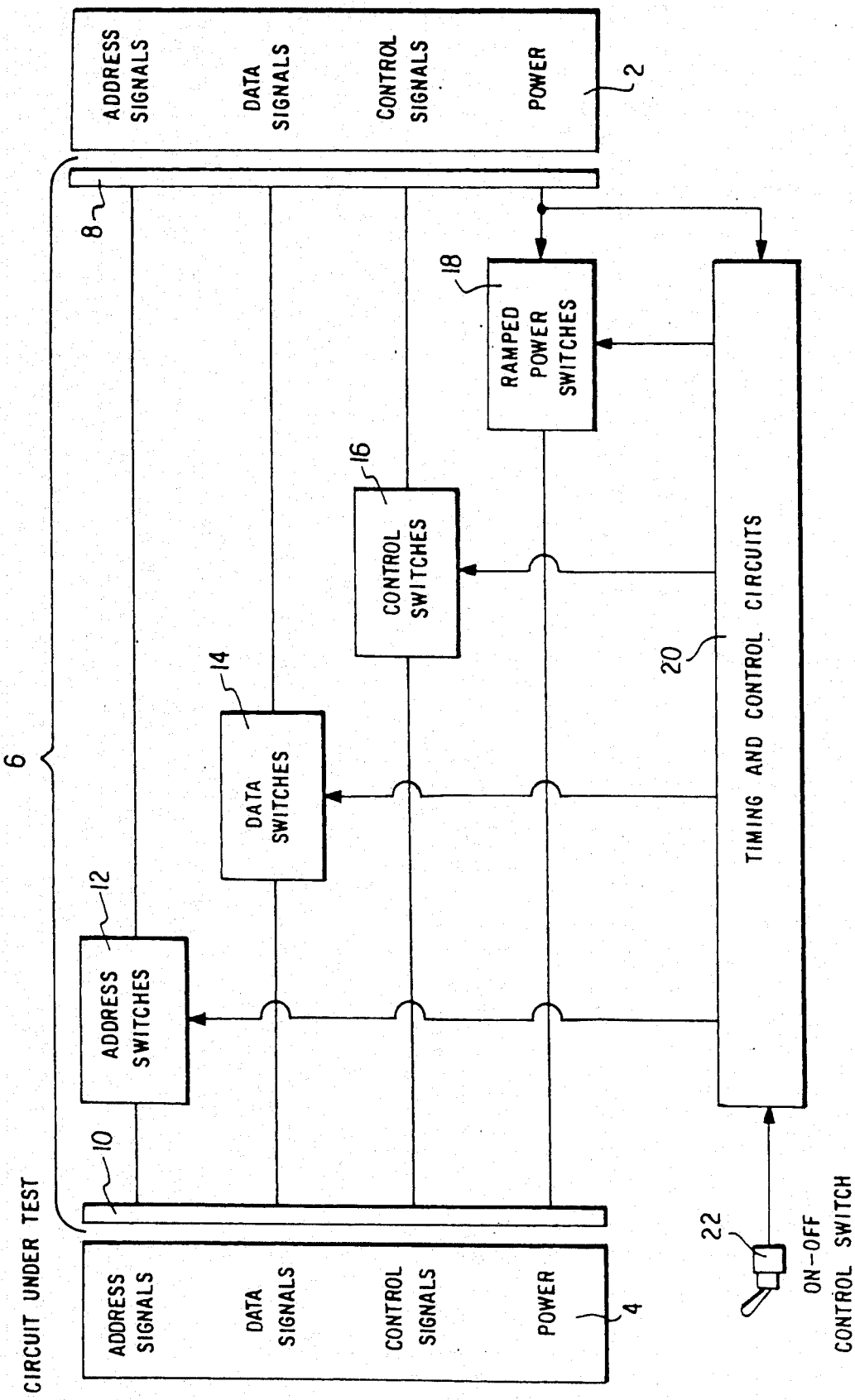
FIG. 1 is a block diagram of an apparatus in accordance with the invention.

With reference to FIG. 1, a piece of electronic equipment 2, such as a small computer, includes a bus providing power, control, data, and address terminals. A circuit under test 4, such as a printed circuit board, has a bus having similar terminals for connection to the bus on the electronic equipment. In accordance with invention, an apparatus 6 is provided for connecting one of a plurality of printed circuit boards to be tested with the electronic equipment 4 without the necessity of inactivating the electronic equipment during exchange of a tested printed circuit board for a subsequent printed circuit board.

Apparatus 6 includes a plurality of switches and a timing and control circuit for controlling the operation of the switches. A first bus 8 is provided for connection to the electronic equipment and a second bus 10 is provided for connection to the circuit under test.

Address switches 12 are connected between terminals on buses 8 and 10 which correspond to address terminals on the electronic equipment 2 and the circuit under test 4. Similarly, data switches 14 are connected between data signal terminals on buses 8 and 10, control switches 16 are connected between control signal terminals on buses 8 and 10, and power switches 18 are connected between power terminals on buses 8 and 10.

A timing and control circuit 20 controls the address, data, control, and power switches in a predetermined sequence. Timing and control circuit 20 may be controlled by instruction signals from a manual switch 22, or it may receive instruction signals from the output bus on the electronic equipment being tested instructing apparatus 6 to activate or deactivate the address, data, control, or power switches.

In a preferred embodiment, the power switch is activated first to apply a ramped power from electronic equipment 2 to the printed circuit board under test. This is followed by activation of the address, data, and control switches in that order. Thus, the circuit board under test first receives power and then receives the address, data, and control signals from the electronic equipment. When the circuit board has been tested and is to be disconnected, this sequence is reversed to allow the circuit board to be turned off without deactivating the electronic equipment. A second printed circuit board to be tested may then be attached to the apparatus 6, and control switch 22 activated to connect the new circuit board to the electronic equipment 2.

Figure 2:
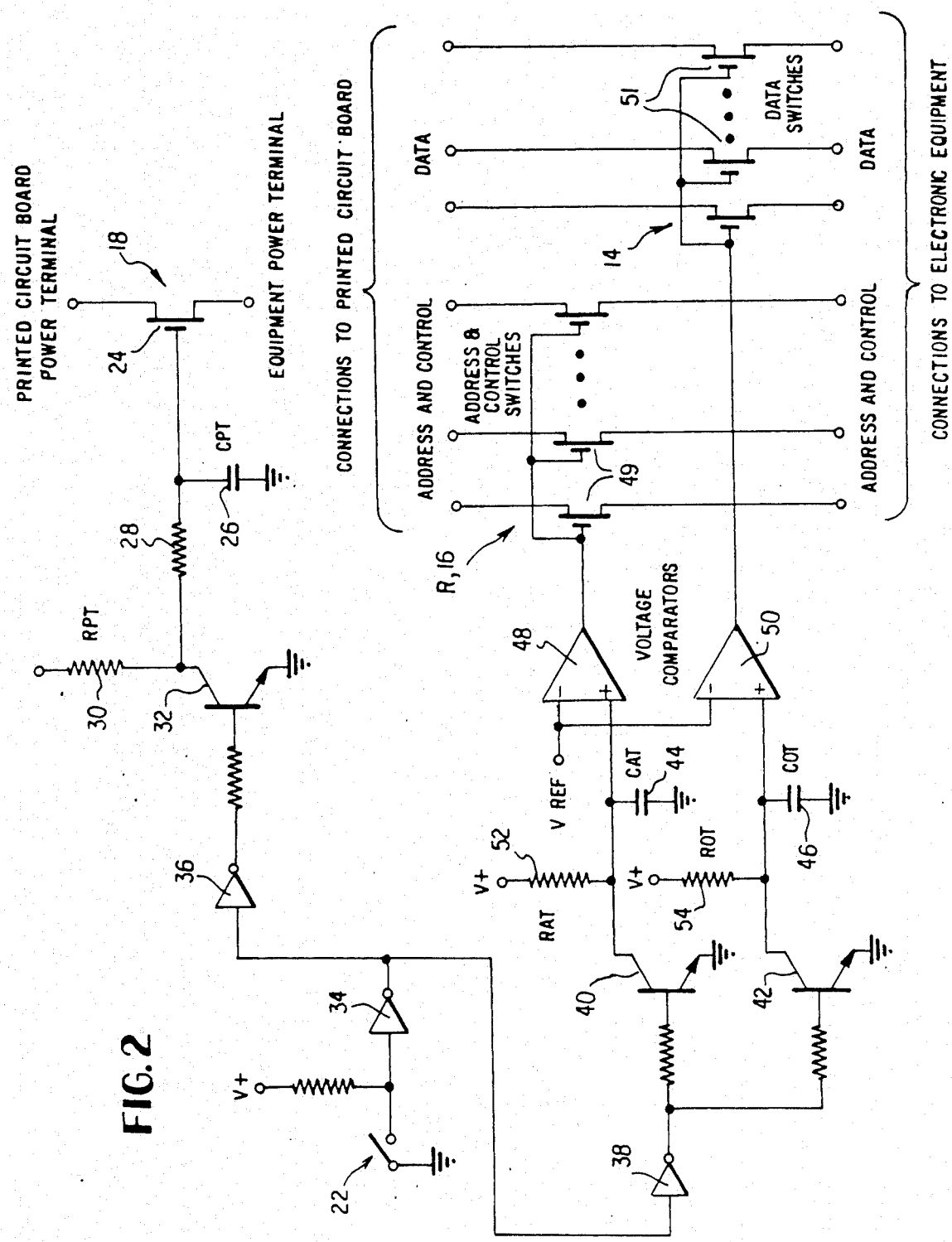
FIG. 2 is a circuit diagram showing a preferred embodiment of the device shown in FIG. 1.

FIG. 2 is a circuit diagram of a preferred embodiment of the invention shown in FIG. 1. A power switch 18 comprises a field effect transistor (FET) 24. FET 24 is controlled by the voltage on capacitor 26, and the voltage on capacitor 26 is a function of a reference voltage and resistors 28 and 30. Transistor switch 32 reduces the voltage across capacitor 26, when activated, to ground voltage, thus turning off FET 24. Transistor switch 32 is activated when switch 22 is opened because it is supplied with a positive reference voltage via amplifiers 34 and 36. Similarly, a positive reference voltage is fed, by amplifier 38 to transistor switches 40 and 42. This positive reference voltage opens these transistor switches, thus reducing the respective voltages at capacitors 44 and 46 to ground. Voltages across capacitors 44 and 46 are compared with a reference voltage by comparator amplifiers 48 and 50, the outputs of which are connected to address, control, and data switches 49 and 51, which are also FET's.

When switch 22 is closed, a ground voltage is applied to switches 32, 40 and 42 to turn them off and allow the voltages at capacitors 26, 44, and 46 to increase. The rate at which the voltages increase, expressed by a time constant, is a known function of the relationship between resistors 30, 52, and 54, and respective capacitors 26, 44, and 46.

The values of the resistors and the capacitors are chosen to provide appropriate time constants and comparator amplifiers 40 and 50 are employed to insure that the power is applied first and at an increasing (ramped) magnitude. Amplifiers 48 and 50 maintain the address, control, and data switches closed until the voltages at capacitors 44 and 46 reach predetermined magnitudes, which are approximately their maximum amplitudes. The time constants of the RC circuits including resistors 30, 28 and 26 are designed such that FET 24 has fully turned on, thus completing the ramp-up of the power signal, prior to the time at which capacitors 44 and 46 are fully charged to turn on the address, control, and data switches.

The above-described sequence is reversed when switch 22 is opened.

The circuit shown in FIG. 2 is advantageous because the turn-on of the circuit is positively controlled by the voltages of the RC networks. This permits the selection of appropriate time constants which are used to control the sequence of the switching.

Other techniques for obtaining the desired sequence of switching will be apparent to those of skill in the art. For example, a microprocessor could be programmed to provide the necessary sequence. As noted above, such a microprocessor could receive signals from the electronic equipment or the circuit under test instructing it either to activate or deactivate the switches. As one example, if a diagnostic program of the electronic equipment determined that the circuit board was defective, it could produce a bus signal causing the timing and control circuit to deactivate that circuit board and produce a flag for the operator of the equipment advising that the circuit board needed to be replaced. Because the circuit board would have been properly turned off by automatic operation of the control, data, address and power switches, the user could then simply unplug the defective circuit board and replace it without inactivating the electronic equipment. The electronic equipment could be advised of this of the replacement, and it would in turn provide a bus instruction signal to the timing and control circuit to reconnect the circuit board.

Modifications of the invention within the scope of the appended claims will be apparent to those of skill in the art.

I claim:

1. Apparatus comprising electronic equipment, a circuit board for testing and being designed to be used with said electronic equipment in the normal operation of said electronic equipment, and switch means connected between said electronic equipment and said circuit board for permitting said circuit board to be tested by removable connection with said electronic equipment, wherein removal or installation of a said circuit board connected directly to said electronic equipment during said normal operation will prevent maintenance of integrity of the circuit board, said switch means comprising means for removably receiving said circuit board and means for selectively transmitting power or bus signals between said electronic equipment and said circuit board in a predetermined sequence for allowing said circuit board to be installed or removed while said electronic equipment remains activated while maintaining the integrity of said circuit board, whereby said circuit board may be installed or removed without inactivating said electronic equipment.

2. Apparatus according to claim 1 wherein said means for selectively transmitting power or bus signals comprises at least one transistor switch and means for activating said at least one transistor switch.

3. Apparatus according to claim 2 wherein said means for activating comprises a manually operated switch.

4. Apparatus according to claim 2 wherein said means for activating comprises means for receiving bus signals and for activating said at least one transistor switch in response to selected said bus signals.

5. Apparatus according to claim 1 wherein said means for selectively transmitting comprises a plurality of switches and timing circuit means for activating said plurality of switches in a predetermined sequence.

6. Apparatus for controlling the connection of a circuit board to be tested to an electronic equipment wherein removal or installation of a said circuit board connected directly to said electronic equipment during normal operation of said electronic equipment will prevent maintenance of integrity of the circuit board, said apparatus comprising bus switch means for connection between a first bus on said electronic equipment and a second bus on said circuit board, said bus switch means comprising a plurality of switches for selectively connecting said first bus to said second bus in response to a first instruction signal, and timing circuit means for activating said plurality of switches in a predetermined sequence in response to said first instruction signal to connect said first bus to said second bus in such a manner that said circuit board may be installed or removed while said electronic equipment remains activated while maintaining the integrity of said circuit board, whereby said circuit board may be installed or removed without inactivating said electronic equipment.

7. Apparatus according to claim 6 wherein said bus switch means comprises power switch means for applying said electrical power to said circuit board such that the magnitude of said power increases as a function of time.

8. Apparatus according to claim 7 wherein upon receipt of said first instruction signal said timing circuit means activates said power switch means and then activates other of said plurality of switches to transmit control, data, or address signals between said circuit board and said electronic equipment.

9. Apparatus according to claim 8 wherein in response to a second instruction signal said timing circuit deactivates said other of said plurality of switches to block transmission of said control, data, or address signals between said electronic equipment and said circuit board and then deactivates said power switch.

10. Apparatus according to claim 9 wherein said power switch comprises means for decreasing the magnitude of said power from said computer to said circuit board as a function of time.

11. Apparatus according to claim 10 wherein said means power switch means comprises a ramp generator and said means for decreasing the magnitude of said power comprises a ramp generator.

12. Apparatus according to claim 11 wherein said plurality of switches are transistor switches.

13. Apparatus according to claim 8 wherein said other of said plurality of switches are logic components.

14. Apparatus according to claim 9 further comprising switch means for manual operation for supplying said first and second instruction signals.

15. Apparatus according to claim 9 wherein said first and second instruction signals are produced by said electronic equipment and said timing circuit comprises means responsive to said instruction signals produced by said electronic equipment.

16. Apparatus according to claim 6 wherein said plurality of switches are mounted on a base, and further comprising first and second connection means on said base, said first connection means comprising means for engaging power, control, data, or address terminals on said electronic equipment and said second connection means comprising means for engaging power, control, data, or address terminals on said circuit board.

17. A method for testing a circuit board designed to be used with electronic equipment in the normal operation of said electronic equipment, wherein removal or installation of said circuit board connected directly to said electronic equipment during said normal operation will prevent maintenance of integrity of the circuit board, said method comprising providing said electronic equipment with means for controlling the connection of said circuit board to said electronic equipment, wherein said means for controlling comprises a plurality of switches for allowing said circuit board to be installed or removed while said electronic equipment remains activated while maintaining the integrity of said circuit board, activating said electronic equipment, attaching said circuit board to said means for controlling such that said plurality of switches are connected between bus terminals on said electronic equipment and corresponding bus terminals on said circuit board, and activating said switches to pass control, data, address or power signals between said electronic equipment and said circuit board.

18. A method according to claim 17 wherein said means for controlling further comprises timing circuit means for activating control, data, or address switches to pass control, data, or address signals to said circuit board after activating power switch means for supplying power to said circuit board in response to a first instruction signal, and further comprising the step of supplying said first instruction signal.

19. A method according to claim 18 wherein said means for controlling comprises means for deactivating said control, data, or address switches and then deactivating said power switch in response to a second instruction signal and further comprising supplying said second instruction signal and removing said circuit board.

20. A method according to claim 17 wherein said means for controlling comprises power switch means for connection between a power terminal of said electronic equipment and a power terminal of said circuit board, control switch means for connection between a control signal terminal of said electronic equipment and a control signal terminal of said circuit board, data switch means for connection between the data signal terminal of said electronic equipment and a data signal terminal of said circuit board, address switch means for connection between an address signal terminal of said electronic equipment and an address signal terminal of said circuit board, and timing circuit means for controlling said address, data, control, and power switches, wherein said timing circuit means activates said power switch upon receipt of a first instruction signal to apply power to said power terminal of said circuit board and subsequently activates said control, data, or address switches to transmit control, data, or address signals from said electronic equipment to said circuit board.

* * * * *